US009989222B2

(12) United States Patent
Tseng et al.

(10) Patent No.: US 9,989,222 B2
(45) Date of Patent: Jun. 5, 2018

(54) LIGHT-EMITTING DEVICE

(71) Applicant: EDISON OPTO CORPORATION, New Taipei (TW)

(72) Inventors: Kuo-Feng Tseng, New Taipei (TW); Shih-Tai Chuang, New Taipei (TW); Chi-Yang Tsou, New Taipei (TW)

(73) Assignee: Edison Opto Corporation, New Taipei (TW)

( * ) Notice: Subject to any disclaimer, the term of this patent is extended or adjusted under 35 U.S.C. 154(b) by 352 days.

(21) Appl. No.: 14/615,043

(22) Filed: Feb. 5, 2015

(65) Prior Publication Data

US 2016/0116141 A1 Apr. 28, 2016

(30) Foreign Application Priority Data

Oct. 24, 2014 (TW) .............................. 103136886 A

(51) Int. Cl.

| F21V 9/00 | (2018.01) |
|---|---|
| F21V 17/10 | (2006.01) |
| H01L 25/075 | (2006.01) |
| F21V 7/06 | (2006.01) |
| F21V 7/04 | (2006.01) |

(Continued)

(52) U.S. Cl.
CPC .......... *F21V 17/10* (2013.01); *H01L 25/0753* (2013.01); *F21K 9/64* (2016.08); *F21V 7/0058* (2013.01); *F21V 7/04* (2013.01); *F21V 7/06* (2013.01); *F21V 13/04* (2013.01); *F21Y 2105/10* (2016.08); *F21Y 2105/12* (2016.08); *F21Y 2115/10* (2016.08); *H01L 2224/45144* (2013.01); *H01L 2224/48137* (2013.01); *H01L 2924/0002* (2013.01); *H01L 2924/181* (2013.01)

(58) Field of Classification Search
CPC ... F21V 9/16; F21V 17/10; F21K 9/00; F21Y 2101/02; F21Y 2105/001; F21Y 2105/005; H01L 25/0753; H01L 33/504
See application file for complete search history.

(56) References Cited

U.S. PATENT DOCUMENTS

| 8,008,850 B2 | 8/2011 | Su et al. |
|---|---|---|
| 2007/0284563 A1 | 12/2007 | Lee et al. |

(Continued)

FOREIGN PATENT DOCUMENTS

WO 2013150470 A1 10/2013

*Primary Examiner* — Elmito Breval
*Assistant Examiner* — Meghan Ulanday
(74) *Attorney, Agent, or Firm* — Winston Hsu

(57) ABSTRACT

A light-emitting device is able to output white in accordance with the white rendering effect required in various application sites. The light-emitting device includes a (circuit) substrate, at least one light-emitting unit disposed on the substrate, an electrically conductive section disposed on the substrate, a protection layer disposed on the substrate, and an electric conductor disposed on the protection layer and electrically connected with the light-emitting unit and the electrically conductive section. The protection layer is formed with a receiving section. The light-emitting unit is positioned in the receiving section and securely enclosed by an adhesive body. The light-emitting device can achieve a pure white general output optical spectrum to overcome the problems of the conventional technique that the structure is complicated, the manufacturing time is longer and the manufacturing cost is higher.

32 Claims, 8 Drawing Sheets

(51) Int. Cl.
    *F21V 7/00*           (2006.01)
    *F21V 13/04*         (2006.01)
    *F21Y 105/12*       (2016.01)
    *F21Y 105/10*       (2016.01)
    *F21K 9/64*          (2016.01)
    *F21Y 115/10*       (2016.01)

(56) References Cited

U.S. PATENT DOCUMENTS

2010/0207135 A1*   8/2010  Aketa ................ H01L 25/0753
                                                                             257/93
2013/0020590 A1*   1/2013  Lin ...................... H01L 33/60
                                                                             257/88

* cited by examiner

LIGHT-EMITTING DEVICE

FIELD OF THE INVENTION

The present invention relates generally to a light-emitting device, which is able to output white light.

BACKGROUND OF THE INVENTION

A conventional light-emitting chip or light-emitting diode (LED) with layout of gold wires and electrodes is used as a light source or illumination device. The LED is widely applied to various sites or environments. In conventional technique, a light-emitting module is often used to project white light onto an exhibited environment or product. The light-emitting module includes blue light LED. The light emitted from the blue light LED energizes yellow fluorescent powder or phosphor to produce white light. Also, red, blue and green LED can be combined into a white light emitting module. For example, US 2007/0284563 A1 discloses a light emitting device including RGB light emitting diodes and phosphor. U.S. Pat. No. 8,008,850 B2 discloses a color temperature tunable white light emitting device, (that is, Taiwanese Patent No. 98125802 "color temperature tunable white light emitting device").

In U.S. Pat. No. 8,008,850 B2, in order to achieve better light output effect, on the LED are arranged components of reflection plate, air medium layer, laminated universal reflector with a refractivity larger than that of the air medium layer, transparent substrate and light diffusion plate. Therefore, the light emitting device has a relatively complicated structure. Also, the manufacturing time of the light emitting device is longer and the manufacturing cost is higher. This is not what we expect.

In conventional technique, in order to achieve better white light rendering index, a wavelength conversion material (such as fluorescent powder or phosphor with a wavelength ranging from 500 nm to 780 nm) is disposed on blue light LED with a wavelength ranging from 440 nm to 460 nm. The wavelength conversion material serves to convert the light emitted from the blue light LED into colored light of green to red. The colored light is mixed with the light emitted from a deep blue light LED with a light wavelength ranging from 400 nm to 440 nm to achieve a pure white light output effect. For example, WO 2013/150470 A1 discloses a white light emitting module.

WO 2013/150470 A1 is characterized in that the wavelength conversion material serves to convert the light emitted from the blue light LED into colored light of green to red. The colored light is mixed with the deep blue light emitted from a deep blue light LED with a certain wavelength or short wavelength to achieve a white output light. The light of the deep blue light LED is not converted by the wavelength conversion material to change the wavelength. In addition, the light of the deep blue light LED is not a normal blue light so that the light emitting module can output pure white light.

It is tried by the applicant to provide a light-emitting device in which the assembly of the components is redesigned in use form and structure to distinguish the light-emitting device from the conventional technique and improve the application thereof. The light-emitting device is able to enhance the white light rendering effect and project white light onto a specific product in an exhibition site or other environment. Also, the light-emitting device of the present invention overcomes the problems of the conventional technique that the structure is complicated, the manufacturing time is longer and the manufacturing cost is higher.

SUMMARY OF THE INVENTION

It is therefore a primary object of the present invention to provide a light-emitting device that is able to output white in accordance with the white rendering effect required in various application sites. The light-emitting device includes a (circuit) substrate, at least one light-emitting unit disposed on the substrate, an electrically conductive section disposed on the substrate, a protection layer disposed on the substrate, and an electric conductor disposed on the protection layer and electrically connected with the light-emitting unit and the electrically conductive section. The protection layer is formed with a receiving section. The light-emitting unit is positioned in the receiving section and securely enclosed by an adhesive body. The light-emitting device can achieve a pure white general output optical spectrum.

In the above light-emitting device, the protection layer is made of dielectric material, including a first structure body and a second structure body in a geometrical form. Each of the first and second structure bodies is formed with an arched notch. The two notches are mated with each other to together form the receiving section. The electric conductor includes a first electric conductor and a second electric conductor each having a semicircular form. The first and second electric conductors together form an annular configuration. The first and second electric conductors are positioned on the protection layer in flush with the configuration of the notches. The first and second structure bodies are formed with connection holes for assembling with the electrically conductive section.

In the above light-emitting device, the light-emitting device composed of the substrate, the protection layer, the electric conductor and the light-emitting unit is assembled with a light guide via a carrier. The carrier is formed with a cavity for assembling with the light-emitting device. The carrier is further formed with a window corresponding to the receiving section for the light of the light-emitting unit to output. The carrier is further formed with assembling holes for mounting the carrier and the light-emitting device at the bottom of the light guide.

BRIEF DESCRIPTION OF THE DRAWINGS

The present invention can be best understood through the following description and accompanying drawings, wherein.

DETAILED DESCRIPTION OF THE PREFERRED EMBODIMENTS

Figure 1:
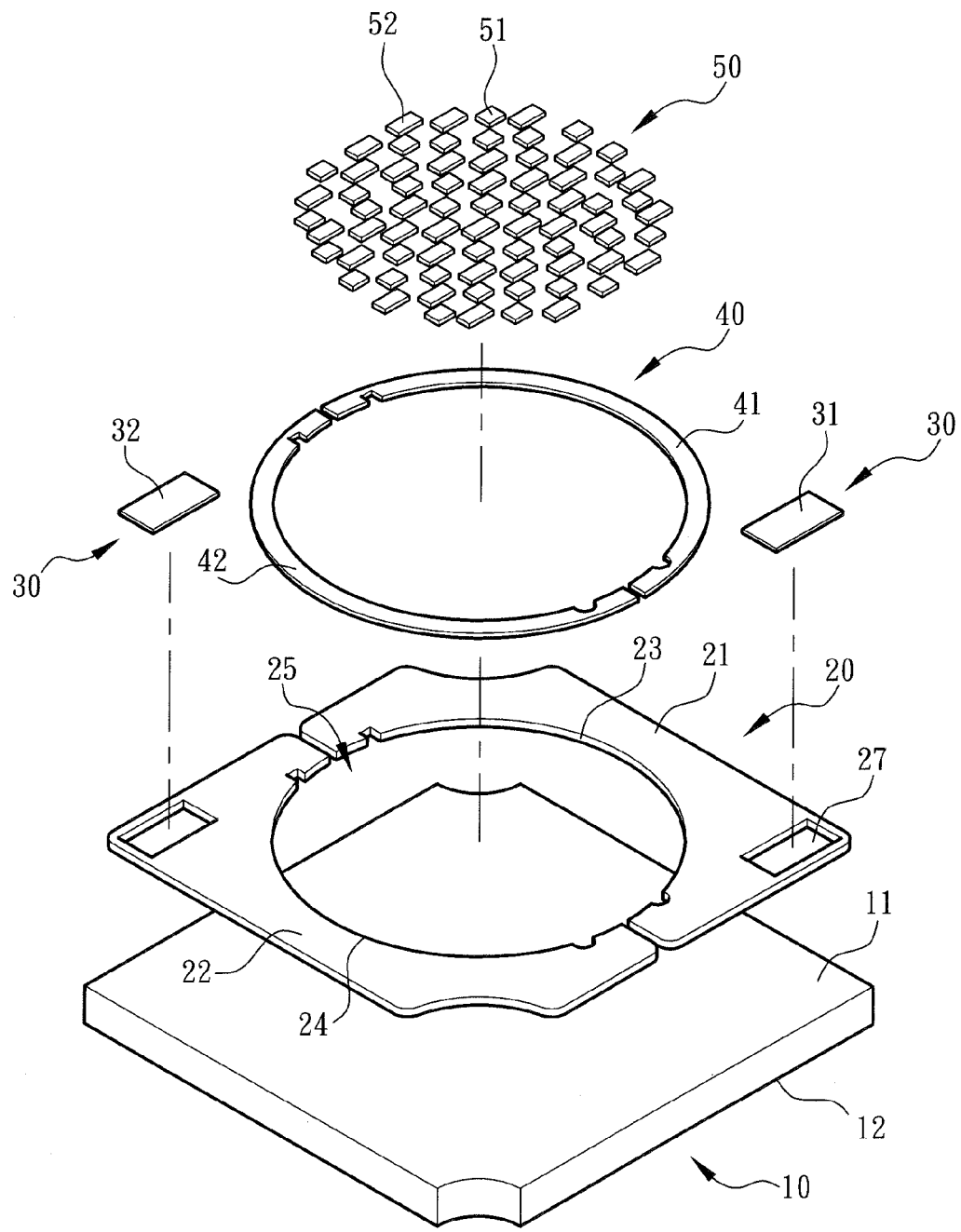
FIG. 1 is a perspective exploded view of the light-emitting device of the present invention, showing the relationship between the light-emitting unit, the electric conductor, the protection layer and the substrate.
Figure 2:
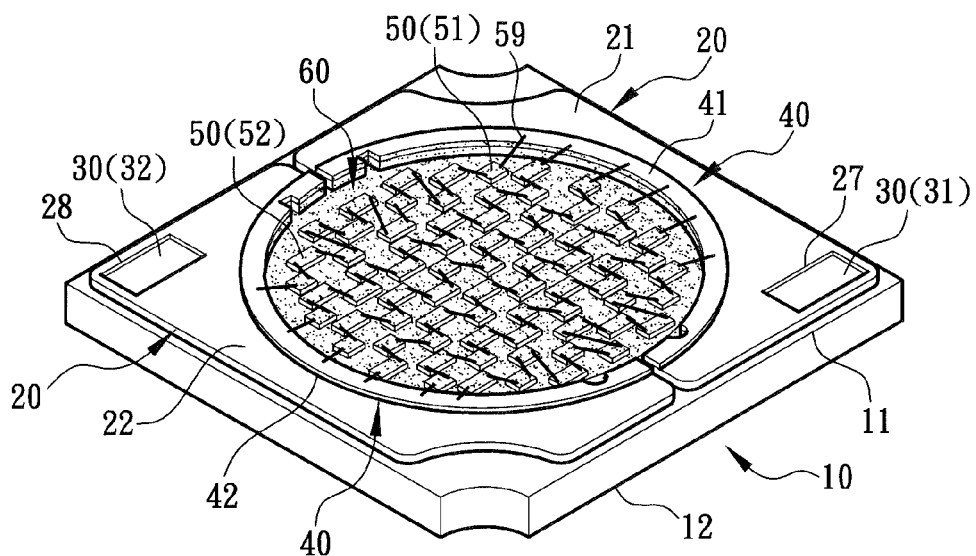
FIG. 2 is a perspective assembled view according to FIG. 1, showing that the receiving section is sealed by the wavelength conversion material to enclose the light-emitting unit.
Figure 3:
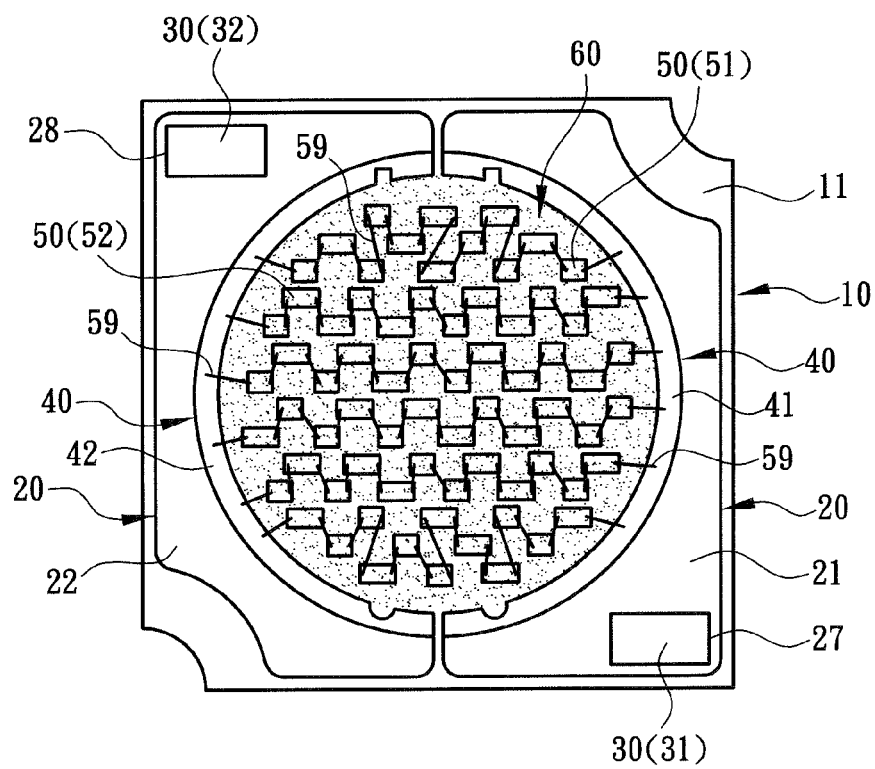
FIG. 3 is a plane view according to FIG. 2, showing that the light-emitting unit is electrically connected with the electric conductor.

Please refer to FIGS. 1, 2 and 3. The light-emitting device of the present invention includes a substrate 10 in a geometrical form. The substrate board 10 is selected from a group consisting of an electro-conductive and heat conduction metal substrate (such as copper substrate or aluminum substrate), metal core printed circuit board (MCPCB) and ceramic substrate. The substrate 10 has a first surface 11 and a second surface 12. A protection layer 20 is disposed on the substrate 10 (or the first surface 11). The protection layer 20 is made of dielectric material, including a first structure body 21 and a second structure body 22 in a geometrical form.

In this embodiment, each of the first and second structure bodies 21, 22 has a rectangular form. A long side of the rectangular form is formed with an arched notch 23, 24. The two notches 23, 24 are mated with each other to together form a circular receiving section 25. The first and second structure bodies 21, 22 of the protection layer 20 are respectively formed with connection holes 27, 28 for assembling with an electrically conductive section 30. The electrically conductive section 30 includes a first electrically conductive section 31 assembled with the connection hole 27 and a second electrically conductive section 32 assembled with the connection hole 28. The first and second electrically conductive sections 31, 32 are made of copper or the like material in the form of a plate. Alternatively, the electrically conductive section 30 (or the first and second electrically conductive sections 31, 32) can be made in the form of a transparent conductive coating.

As shown in the drawings, an electric conductor 40 is disposed on the protection layer 20. The electric conductor 40 includes a first electric conductor 41 and a second electric conductor 42 each having a semicircular form. In this embodiment, the first and second electric conductors 41, 42 together form an annular configuration. The first and second electric conductors 41, 42 are positioned on the protection layer 20 in flush with the configuration of the notches 23, 24.

Referring to FIGS. 2 and 3, at least one (white) light-emitting unit 50 is disposed on the substrate 10 (or the first surface 11) and positioned in the receiving section 25. The light-emitting unit 50 is electrically connected with the electric conductor 40 and the first electrically conductive section 31 (or the second electrically conductive section 32) to achieve a pure white general output optical spectrum.

That is, the first and second electrically conductive sections 31, 32 are connected to an external power source (which can be considered to be external to the present invention), whereby the power is transmitted to the first and second electric conductors 41, 42 and the light-emitting unit 50. The light-emitting unit 50 (or an ultraviolet ray emitting diode 51 and a blue light emitting diode 52) is provided with connection wires 59 (such as gold wires) for connecting with the first or second electric conductor 41, 42.

As shown in FIGS. 2 and 3, the light-emitting unit 50 includes at least one ultraviolet ray emitting diode 51 and at least one blue light emitting diode 52. The ultraviolet ray emitting diode 51 has a light wavelength or optical spectrum ranging from 380 nm to 420 nm. The blue light emitting diode 52 has a light wavelength or optical spectrum ranging from 440 nm to 470 nm. An adhesive body 60 is laid in the receiving section 25 to securely enclose (i.e. to encapsulate) the light-emitting unit 50. The adhesive body 60 contains at least one or multiple wavelength conversion materials for at least receiving the light emitted from the ultraviolet ray emitting diode 51 and/or the blue light emitting diode 52 to energize the light of the ultraviolet ray emitting diode 51 to produce a visible light and convert the light of the blue light emitting diode 52 into white light. After mixing the light, a pure white general output optical spectrum is achieved.

In a preferred embodiment, the wavelength conversion material includes a first wavelength conversion material and a second wavelength conversion material. The first wavelength conversion material converts or energizes the ultraviolet ray emitting diode 51 to produce an expected visible light (such as a colored light with color temperature ranging from 2000K to 18000K). The second wavelength conversion material converts or energizes the blue light emitting diode 52 to produce an expected visible light (such as a colored light with color temperature ranging from 2000K to 18000K). That is, the wavelength conversion material includes at least one fluorescent material (such as fluorescent powder, fluorescent agent or phosphor) and/or a combination of multiple colored UV fluorescent materials such as green, yellow and red fluorescent powders.

To speak more specifically, the first wavelength conversion material includes at least one UV fluorescent material (such as UV fluorescent powder, UV fluorescent agent or UV phosphor) or a combination of multiple colored UV fluorescent materials and is able to convert the light emitted from the ultraviolet ray emitting diode 51 into white light or other colored light (such as visible light of green to red or colored light with a wavelength ranging from 500 nm to 660 nm). The second wavelength conversion material includes at least one fluorescent material to convert the light emitted from the blue light emitting diode 52 into white light. Accordingly, the light-emitting device as a whole can achieve a pure white general output optical spectrum.

Figure 4:
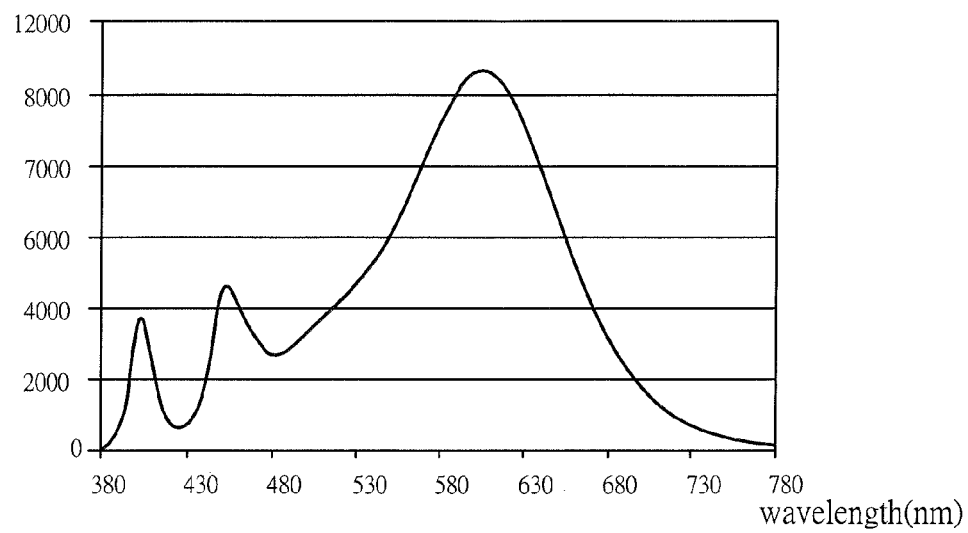
FIG. 4 is a diagram of an optical spectrum of the light-emitting device of the present invention, showing the light wavelength output range of the combination of the light-emitting unit and the wavelength conversion material.

That is, the ultraviolet ray emitted from the ultraviolet ray emitting diode 51 energizes the UV fluorescent material of the first wavelength conversion material and is converted into white light or visible light of green to red, (for example, colored light with a wavelength ranging from 500 nm to 660 nm). The second wavelength conversion material mainly contains yellow fluorescent powder. The blue light emitted from the blue light emitting diode 52 energizes the second wavelength conversion material and is converted into white output light. The white output light is mixed with the white light or visible light of green to red converted from the ultraviolet ray of the ultraviolet ray emitting diode 51 by the first wavelength conversion material and output. Accordingly, the light-emitting device has better white light color rendering index as the optical spectrum of FIG. 4.

Figure 5:
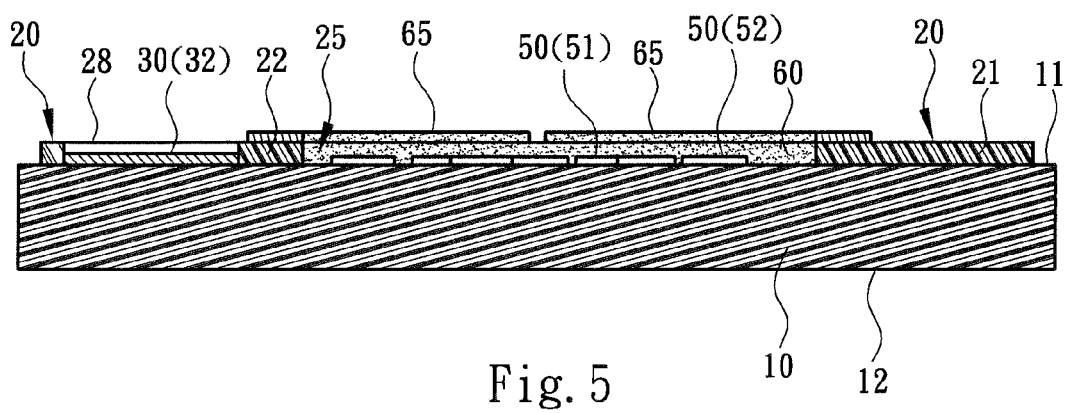
FIG. 5 is a sectional view of the light-emitting device of the present invention.

Please now refer to FIG. 5, which shows a modified embodiment of the present invention. In this embodiment, the adhesive body 60 seals the receiving section 25 to securely enclose the light-emitting unit 50. Moreover, the wavelength conversion material (denoted with reference numeral 65 in this embodiment) is disposed in a position spaced from the light-emitting unit 50 by a set distance or height. FIG. 5 shows that the wavelength conversion material 65 is disposed in flush with the electric conductor 40.

Figure 6:
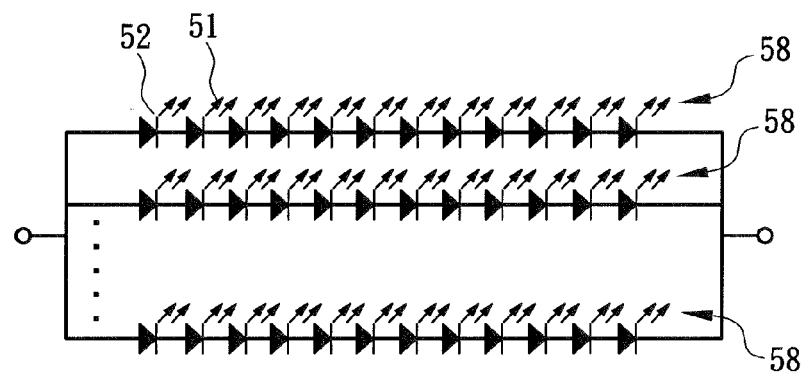
FIG. 6 is a circuit diagram of the light-emitting device of the present invention.

Please now refer to FIG. 6. In a preferred embodiment, the light-emitting units 50 (or the ultraviolet ray emitting diodes 51 and the blue light emitting diodes 52) are connected with each other in series and/or in parallel. That is, the adjacent ultraviolet ray emitting diodes 51 and blue light emitting diodes 52 are connected in series via the connection wires 59 to form a light-emitting string 58. Each light-emitting string 58 is electrically connected with the electric conductor 40 (the first electric conductor 41 or the second electric conductor 42). The respective light-emitting strings 58 are connected in parallel.

Figure 7:
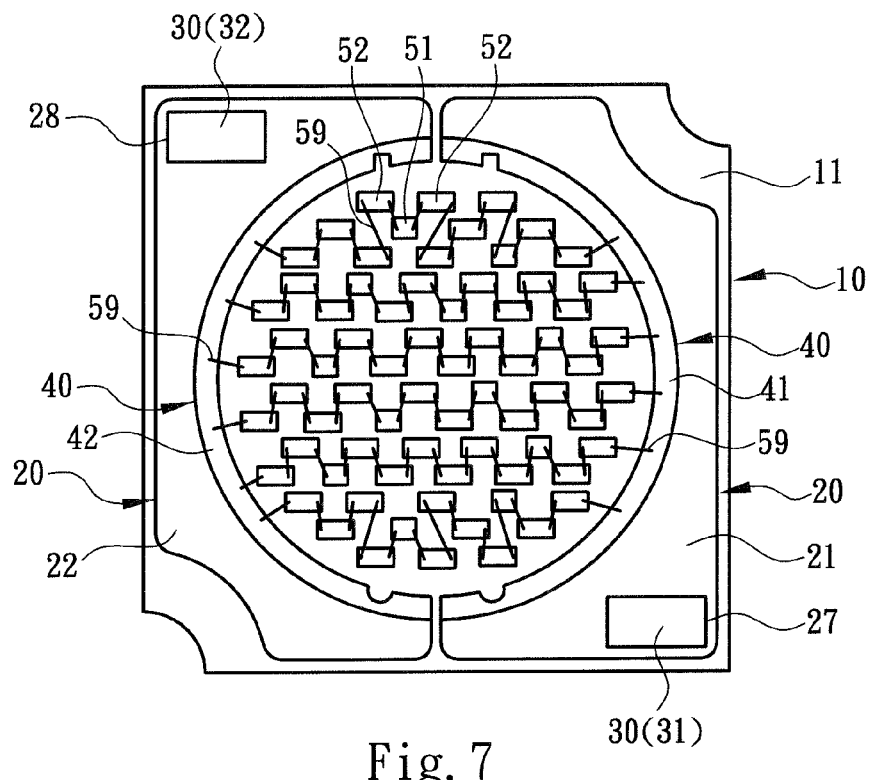
FIG. 7 is a plane view of the light-emitting device of the present invention, showing that the light-emitting units are arranged in such a manner that multiple blue light emitting diodes are arranged around an ultraviolet ray emitting diode.

FIG. 7 shows a modified embodiment of the present invention. In this embodiment, the light-emitting units 50 are arranged in such a manner that multiple blue light emitting diodes 52 are arranged around an ultraviolet ray emitting diode 51. After tested, it is found that the color rendering index (CRI) of the light-emitting device is up to a value over 80.

Figure 8:
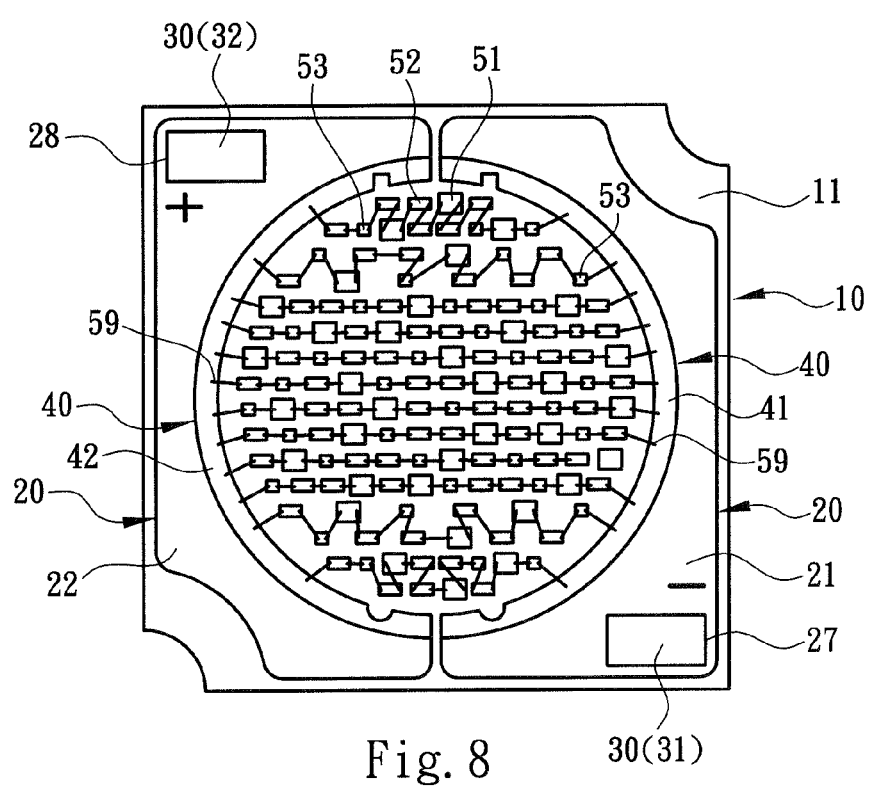
FIG. 8 is a plane view of the light-emitting device of the present invention, showing that the light-emitting units are arranged in such a manner that multiple ultraviolet ray emitting diode, multiple blue light emitting diodes and multiple red light emitting diodes are arranged in the receiving section.
Figure 9:
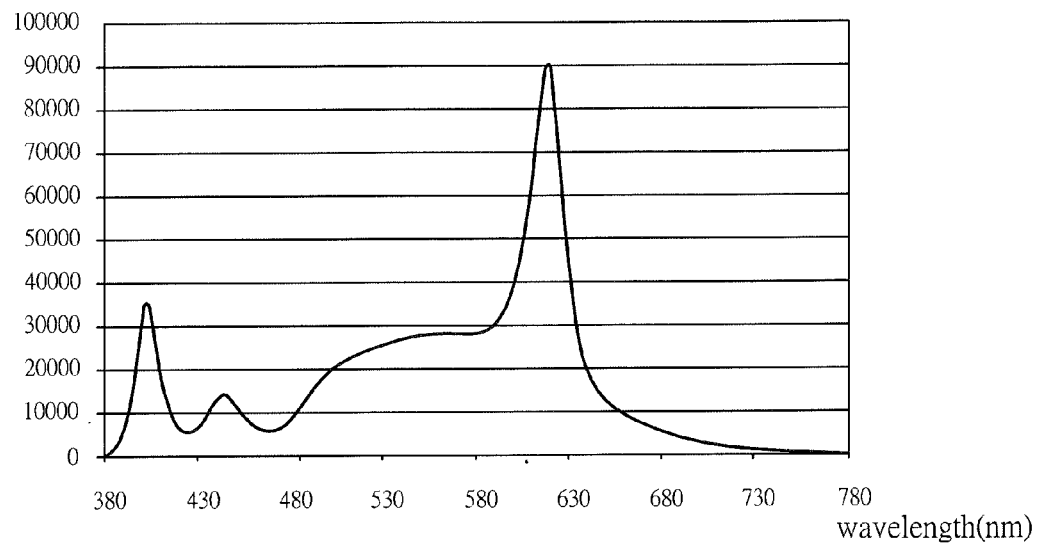
FIG. 9 is a diagram of an optical spectrum of the light-emitting device of the present invention according to FIG. 8, showing the light wavelength output range of the combination of the light-emitting diodes and the wavelength conversion material.

FIGS. 8 and 9 show another embodiment of the present invention. In this embodiment, the light-emitting units 50 are arranged in such a manner that multiple ultraviolet ray emitting diode 51, multiple blue light emitting diodes 52 and multiple red light emitting diodes 53 are arranged in the receiving section 25. The red light emitting diodes 53 have a light wavelength or optical spectrum ranging from 610 nm to 650 nm. Therefore, as a whole, the color rendering index of the light-emitting device is as increased as possible and the original color rendering effect of white article is enhanced. After testing, it is found that the color rendering index (CRI) of the light-emitting device is up to a value over 90 as shown by the optical spectrum of FIG. 9 according to the embodiment of FIG. 8.

Figure 10:
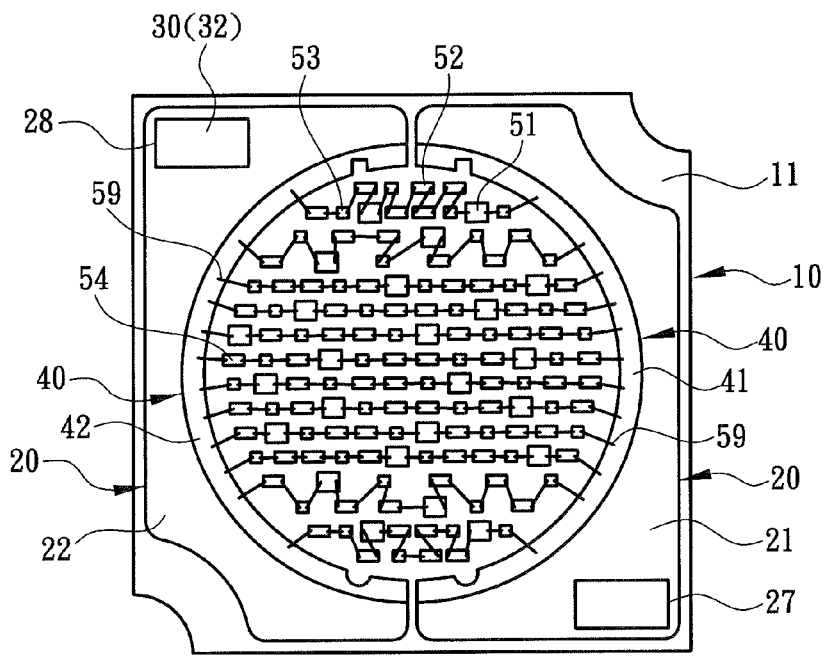
FIG. 10 is a plane view of the light-emitting device of the present invention, showing that the light-emitting units are arranged in such a manner that multiple ultraviolet ray emitting diode, multiple blue light emitting diodes, multiple red light emitting diodes and multiple green light emitting diodes are arranged in the receiving section.

Please refer to FIG. 10, which shows still another embodiment of the present invention. In this embodiment, the light-emitting units 50 are arranged in such a manner that multiple ultraviolet ray emitting diode 51, multiple blue light emitting diodes 52, multiple red light emitting diodes 53 and multiple green light emitting diodes 54 are arranged in the receiving section 25.

Basically, after the lights of the blue light emitting diodes 52, the red light emitting diodes 53 and the green light emitting diodes 54 are mixed, a white light is produced. In this embodiment, the blue light emitting diodes 52, the red light emitting diodes 53 and the green light emitting diodes 54 can respectively energize the fluorescent materials of the wavelength conversion materials to adjust or enhance the output amount of the blue light or red light or green light. Therefore, the color rendering index of the entire light-emitting device is as increased as possible similar to the above embodiments and the original color rendering effect of white article is enhanced.

In a modified embodiment, the ultraviolet ray emitted from the ultraviolet ray emitting diodes 51 is used to energize the UV fluorescent materials of the wavelength conversion material, (such as the red light, green light and blue light UV fluorescent materials). Accordingly, the ultraviolet ray emitted from the ultraviolet ray emitting diodes 51 respectively energizes the red light, green light and blue light UV fluorescent materials to convert and produce white light or visible light of green to red (such as colored light with a light wavelength ranging from 500 nm to 660 nm). Accordingly, a white light output or rendering effect can be achieved comparable to a halogen lamp.

Figure 11:
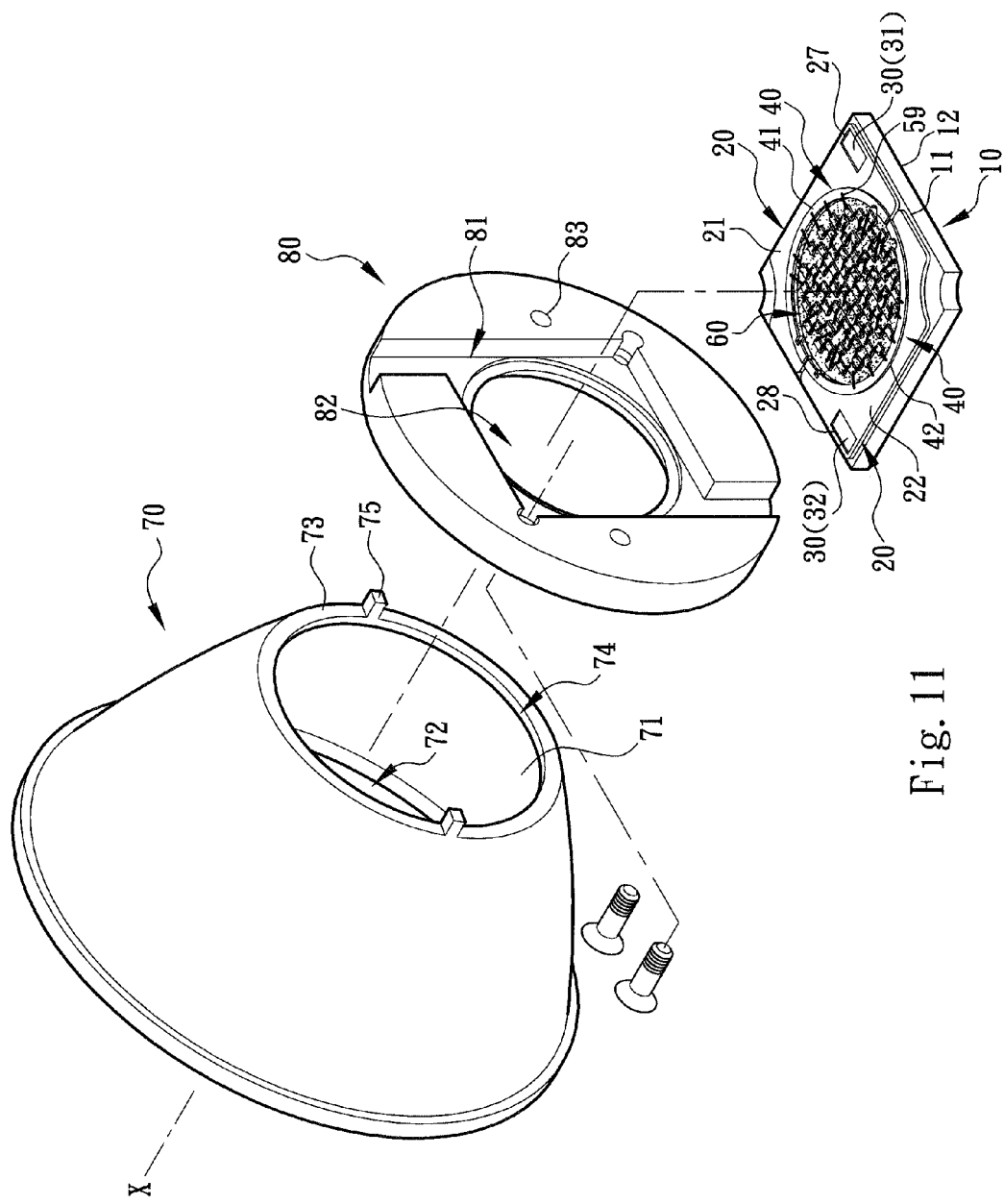
FIG. 11 is a perspective exploded view of a modified embodiment of the light-emitting device of the present invention, showing that the light-emitting device is assembled with a secondary optical member.
Figure 12:
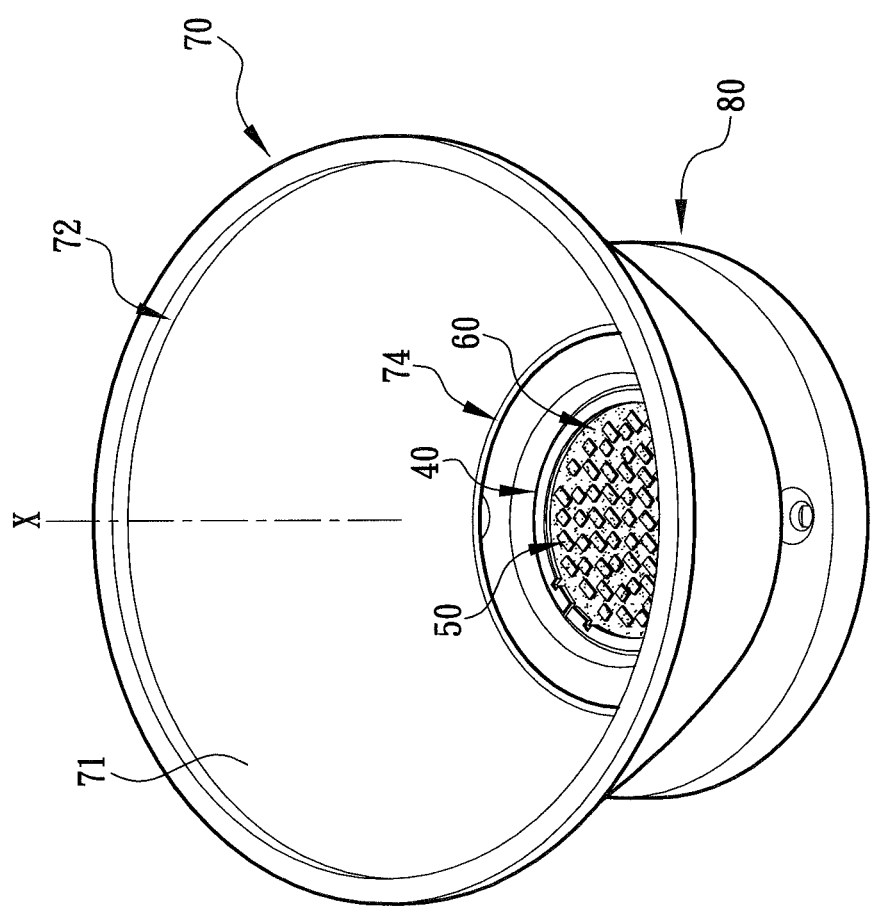
FIG. 12 is a perspective assembled view according to FIG. 12.
Figure 13:
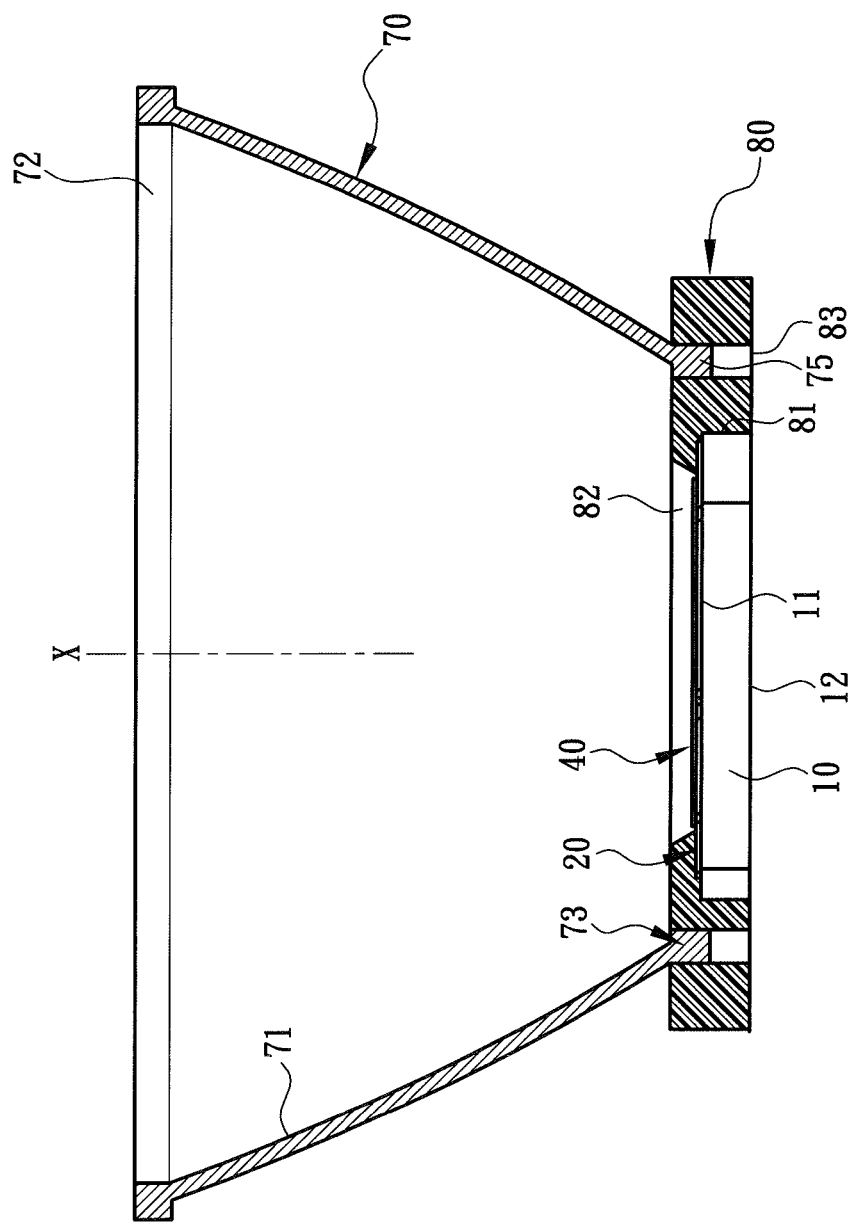
FIG. 13 is a sectional view according to FIG. 12.

Please refer to FIGS. 11, 12 and 13. The light-emitting device composed of the substrate 10, the protection layer 20, the electric conductor 40 and the light-emitting unit 50 is selectively disposed on the bottom 73 of a secondary optical member, (that is, a light guide 70) via a carrier 80. The light guide 70 is an optical reflection member including a reflection wall 71, an upper opening 72 (or light emission opening) connected with the reflection wall 71 and a lower opening 74. The lower opening 74 is formed at the bottom 73. The reflection wall 71 is a reflection layer with reflection material. For example, the reflection layer can be a metal surface reflection layer or a texture/structure of other material with reflection effect. The reflection wall 71 has a bowl-shaped form, a parabolic form or other geometrical form on the basis of a reference axis $\chi$.

In this embodiment, the carrier 80 has a geometrical form and is formed with a cavity 81 for assembling with the light-emitting device. The carrier 80 is formed with a window 82 corresponding to the receiving section 25 for the light of the light-emitting unit 50 to output.

As shown in the drawings, the carrier 80 is formed with assembling holes 83 for mounting the carrier 80 at the bottom 73 of the light guide. To speak more specifically, stakes 75 are formed at the bottom 73 of the light guide. The stakes 75 are inserted in the assembling holes 83 of the carrier 80. In this embodiment, an optical lens or the wavelength conversion material can be positioned at the upper opening 72 of the light guide 70 to change or adjust the light output effect of the light-emitting device.

In comparison with the conventional technique, the light-emitting device of the present invention provides white light output effect and has the following advantages:

The light-emitting device and the relevant components thereof are redesigned in use, structure and connection relationship. For example, the first and second structure bodies 21, 22 of the protection layer 20 are respectively formed with notches 23, 24 to together define the receiving section 25. The light-emitting unit 50 is positioned in the receiving section 25. The first and second electric conductors 41, 42 are positioned on the protection layer 20 in flush with the notches 23, 24. The light-emitting unit 50 is assembled with the wavelength conversion material. The light emitted from the light-emitting unit 50 serves to energize the UV fluorescent material. The substrate 10 is disposed on the light guide 70 via the carrier 80. The light-emitting device of the present invention is different from the conventional LED assembly. The light-emitting device of the present invention is also changed in use form and application range to apparently enhance the white light output effect. Accordingly, the light-emitting device of the present invention is able to enhance the white light rendering effect and project white light onto a specific product in an exhibition site or other environment.

The light-emitting device of the present invention overcomes the problems of the conventional technique that the structure is complicated, the manufacturing time is longer and the manufacturing cost is higher.

The above embodiments are only used to illustrate the present invention, not intended to limit the scope thereof. Many modifications of the above embodiments can be made without departing from the spirit of the present invention.

What is claimed is:

1. A light-emitting device comprising:
   a substrate having a first surface and a second surface;
   at least one light-emitting unit disposed on the first surface of the substrate;
   a protection layer disposed on the first surface of the substrate;
   an electrically conductive section disposed on the first surface of the substrate and connected to external power source, the protection layer being made of dielectric material and formed with a receiving section, the light-emitting unit being positioned in the receiving section and securely enclosed by an adhesive body; and
   an electric conductor disposed on the protection layer and electrically connected with the light-emitting unit and the electrically conductive section;
   wherein the protection layer includes a first structure body and a second structure body in a geometrical form, each of the first and second structure bodies being formed with a notch, the two notches being mated with each other to together form the receiving section, the first and second structure bodies of the protection layer being respectively formed with connection holes for assembling with the an electrically conductive section, the electrically conductive section including a first electrically conductive section assembled with the connection hole of the first structure body and a second electrically conductive section assembled with the connection hole of the second structure body, the electric conductor including a first electric conductor and a second electric conductor, the first and second electric conductors being disposed on the protection layer in flush with the notches, each of the first and second structure bodies of the protection layer has a rectangular form, a long side of the rectangular form being formed with an arched notch, the notches of the first and second structure bodies together forming the receiving section in a circular form, each of the first and second electric conductors having a semicircular form, a first electric conductor and a second electric conductor, the first and second electric conductors together forming an annular configuration and being disposed on the protection layer in flush with the configuration of the notches.

2. The light-emitting device as claimed in claim 1, wherein the light-emitting unit includes at least one ultraviolet ray emitting diode and at least one blue light emitting diode, the ultraviolet ray emitting diode having a light wavelength ranging from 380 nm to 420 nm, the blue light emitting diode having a light wavelength ranging from 440 nm to 470 nm, the adhesive body containing a wavelength conversion material, the wavelength conversion material including a first wavelength conversion material and a second wavelength conversion material, the first wavelength conversion material having at least one UV fluorescent material for converting the light emitted from the ultraviolet ray emitting diode to produce a colored light with color temperature ranging from 2000K to 18000K, the UV fluorescent material being at least one of blue light UV fluorescent material, green light UV fluorescent material and red light UV fluorescent material, the second wavelength conversion material having at least one fluorescent material for converting the light emitted from the blue light emitting diode into a colored light with color temperature ranging from 2000K to 18000K, the fluorescent material of the second wavelength conversion material being at least one of yellow light fluorescent material, green light fluorescent material and red light fluorescent material.

3. The light-emitting device as claimed in claim 2, wherein the light-emitting units are arranged in such a manner that multiple blue light emitting diodes are arranged around an ultraviolet ray emitting diode.

4. The light-emitting device as claimed in claim 2, wherein the light-emitting unit further has at least one red light emitting diode with a light wavelength ranging from 610 nm to 650 nm.

5. The light-emitting device as claimed in claim 2, wherein the light-emitting unit further has at least one green light emitting diode.

6. The light-emitting device as claimed in claim 2, wherein the light-emitting units are connected with each other in series to form a light-emitting string, the light-emitting strings being connected in parallel.

7. The light-emitting device as claimed in claim 2, wherein the light-emitting device composed of the substrate, the protection layer, the electric conductor and the light-emitting unit is disposed on a bottom of a light guide via a carrier, the substrate being selected from a group consisting of metal substrate, metal core printed circuit board and ceramic substrate, the light guide being an optical reflection member including a reflection wall, an upper opening connected with the reflection wall and a lower opening, the lower opening being formed at the bottom of the light guide, the reflection wall being a reflection layer with reflection material, the reflection wall having a bowl-shaped form or a parabolic form on the basis of a reference axis, the carrier being formed with a cavity for assembling with the light-emitting device, the carrier being formed with a window corresponding to the receiving section for the light of the light-emitting unit to output.

8. The light-emitting device as claimed in claim 7, wherein stakes are formed at the bottom of the light guide and the carrier is formed with assembling holes corresponding to the stakes for mounting the carrier at the bottom of the light guide.

9. The light-emitting device as claimed in claim 1, wherein the light-emitting unit includes at least one ultraviolet ray emitting diode and at least one blue light emitting diode, the ultraviolet ray emitting diode having a light wavelength ranging from 380 nm to 420 nm, the blue light emitting diode having a light wavelength ranging from 440 nm to 470 nm, a wavelength conversion material being disposed in a position spaced from the light-emitting unit by a set height, the wavelength conversion material including a first wavelength conversion material and a second wavelength conversion material, the first wavelength conversion material having at least one UV fluorescent material for converting the light emitted from the ultraviolet ray emitting diode to produce a colored light with color temperature ranging from 2000K to 18000K, the UV fluorescent material being at least one of blue light UV fluorescent material, green light UV fluorescent material and red light UV fluorescent material, the second wavelength conversion material having at least one fluorescent material for converting the light emitted from the blue light emitting diode into a colored light with color temperature ranging from 2000K to 18000K, the fluorescent material of the second wavelength conversion material being at least one of yellow light fluorescent material, green light fluorescent material and red light fluorescent material.

10. The light-emitting device as claimed in claim 9, wherein the light-emitting units are arranged in such a manner that multiple blue light emitting diodes are arranged around an ultraviolet ray emitting diode.

11. The light-emitting device as claimed in claim 9, wherein the light-emitting unit further has at least one red light emitting diode with a light wavelength ranging from 610 nm to 650 nm.

12. The light-emitting device as claimed in claim 9, wherein the light-emitting unit further has at least one green light emitting diode.

13. The light-emitting device as claimed in claim 9, wherein the light-emitting units are connected with each other in series to form a light-emitting string, the light-emitting strings being connected in parallel.

14. The light-emitting device as claimed in claim 9, wherein the light-emitting device composed of the substrate, the protection layer, the electric conductor and the light-emitting unit is disposed on a bottom of a light guide via a carrier, the substrate being selected from a group consisting of metal substrate, metal core printed circuit board and ceramic substrate, the light guide being an optical reflection member including a reflection wall, an upper opening connected with the reflection wall and a lower opening, the lower opening being formed at the bottom of the light guide, the reflection wall being a reflection layer with reflection material, the reflection wall having a bowl-shaped form or a parabolic form on the basis of a reference axis, the carrier being formed with a cavity for assembling with the light-emitting device, the carrier being formed with a window corresponding to the receiving section for the light of the light-emitting unit to output.

15. The light-emitting device as claimed in claim 14, wherein stakes are formed at the bottom of the light guide and the carrier is formed with assembling holes corresponding to the stakes for mounting the carrier at the bottom of the light guide.

16. The light-emitting device as claimed in claim 1, wherein the light-emitting units are connected with each other in series to form a light-emitting string, the light-emitting strings being connected in parallel.

17. The light-emitting device as claimed in claim 1, wherein the light-emitting device composed of the substrate, the protection layer, the electric conductor and the light-emitting unit is disposed on a bottom of a light guide via a carrier, the substrate being selected from a group consisting of metal substrate, metal core printed circuit board and ceramic substrate, the light guide being an optical reflection member including a reflection wall, an upper opening connected with the reflection wall and a lower opening, the lower opening being formed at the bottom of the light guide, the reflection wall being a reflection layer with reflection material, the reflection wall having a bowl-shaped form or a parabolic form on the basis of a reference axis, the carrier being formed with a cavity for assembling with the light-emitting device, the carrier being formed with a window corresponding to the receiving section for the light of the light-emitting unit to output.

18. The light-emitting device as claimed in claim 17, wherein stakes are formed at the bottom of the light guide and the carrier is formed with assembling holes corresponding to the stakes for mounting the carrier at the bottom of the light guide.

19. A light-emitting device comprising:
a substrate having a first surface and a second surface;
at least one light-emitting unit disposed on the first surface of the substrate;
a protection layer disposed on the first surface of the substrate;
an electrically conductive section disposed on the first surface of the substrate and connected to external power source, the protection layer being made of dielectric material and formed with a receiving section, the light-emitting unit being positioned in the receiving section and securely enclosed by an adhesive body; and
an electric conductor disposed on the protection layer and electrically connected with the light-emitting unit and the electrically conductive section;
wherein the light-emitting unit includes at least one ultraviolet ray emitting diode and at least one blue light emitting diode, the ultraviolet ray emitting diode having a light wavelength ranging from 380 nm to 420 nm, the blue light emitting diode having a light wavelength ranging from 440 nm to 470 nm, the adhesive body containing a wavelength conversion material, the wavelength conversion material including a first wavelength conversion material and a second wavelength conversion material, the first wavelength conversion material having at least one UV fluorescent material for converting the light emitted from the ultraviolet ray emitting diode to produce a colored light with color temperature ranging from 2000K to 18000K, the UV fluorescent material being at least one of blue light UV fluorescent material, green light UV fluorescent material and red light UV fluorescent material, the second wavelength conversion material having at least one fluorescent material for converting the light emitted from the blue light emitting diode into a colored light with color temperature ranging from 2000K to 18000K, the fluorescent material of the second wavelength conversion material being at least one of yellow light fluorescent material, green light fluorescent material and red light fluorescent material.

20. The light-emitting device as claimed in claim 19, wherein the light-emitting units are arranged in such a manner that multiple blue light emitting diodes are arranged around an ultraviolet ray emitting diode.

21. The light-emitting device as claimed in claim 19, wherein the light-emitting unit further has at least one red light emitting diode with a light wavelength ranging from 610 nm to 650 nm.

22. The light-emitting device as claimed in claim 19, wherein the light-emitting unit further has at least one green light emitting diode.

23. The light-emitting device as claimed in claim 19, wherein the light-emitting units are connected with each other in series to form a light-emitting string, the light-emitting strings being connected in parallel.

24. The light-emitting device as claimed in claim 19, wherein the light-emitting device composed of the substrate, the protection layer, the electric conductor and the light-emitting unit is disposed on a bottom of a light guide via a carrier, the substrate being selected from a group consisting of metal substrate, metal core printed circuit board and ceramic substrate, the light guide being an optical reflection member including a reflection wall, an upper opening connected with the reflection wall and a lower opening, the lower opening being formed at the bottom of the light guide, the reflection wall being a reflection layer with reflection material, the reflection wall having a bowl-shaped form or a parabolic form on the basis of a reference axis, the carrier being formed with a cavity for assembling with the light-emitting device, the carrier being formed with a window corresponding to the receiving section for the light of the light-emitting unit to output.

25. The light-emitting device as claimed in claim 24, wherein stakes are formed at the bottom of the light guide and the carrier is formed with assembling holes corresponding to the stakes for mounting the carrier at the bottom of the light guide.

26. A light-emitting device comprising:
a substrate having a first surface and a second surface;
at least one light-emitting unit disposed on the first surface of the substrate;
a protection layer disposed on the first surface of the substrate;
an electrically conductive section disposed on the first surface of the substrate and connected to external power source, the protection layer being made of dielectric material and formed with a receiving section, the light-emitting unit being positioned in the receiving section and securely enclosed by an adhesive body; and
an electric conductor disposed on the protection layer and electrically connected with the light-emitting unit and the electrically conductive section;
wherein the light-emitting unit includes at least one ultraviolet ray emitting diode and at least one blue light emitting diode, the ultraviolet ray emitting diode having a light wavelength ranging from 380 nm to 420 nm, the blue light emitting diode having a light wavelength ranging from 440 nm to 470 nm, a wavelength conversion material being disposed in a position spaced from the light-emitting unit by a set height, the wavelength conversion material including a first wavelength conversion material and a second wavelength conversion material, the first wavelength conversion material having at least one UV fluorescent material for converting the light emitted from the ultraviolet ray emitting diode to produce a colored light with color temperature ranging from 2000K to 18000K, the UV fluorescent material being at least one of blue light UV fluorescent material, green light UV fluorescent material and red light UV fluorescent material, the second wavelength conversion material having at least one fluorescent material for converting the light emitted from the blue light emitting diode into a colored light with color temperature ranging from 2000K to 18000K, the fluorescent material of the second wavelength conversion material being at least one of yellow light fluorescent material, green light fluorescent material and red light fluorescent material.

27. The light-emitting device as claimed in claim 26, wherein the light-emitting units are arranged in such a manner that multiple blue light emitting diodes are arranged around an ultraviolet ray emitting diode.

28. The light-emitting device as claimed in claim 26, wherein the light-emitting unit further has at least one red light emitting diode with a light wavelength ranging from 610 nm to 650 nm.

29. The light-emitting device as claimed in claim 26, wherein the light-emitting unit further has at least one green light emitting diode.

30. The light-emitting device as claimed in claim 26, wherein the light-emitting units are connected with each other in series to form a light-emitting string, the light-emitting strings being connected in parallel.

31. The light-emitting device as claimed in claim 26, wherein the light-emitting device composed of the substrate, the protection layer, the electric conductor and the light-emitting unit is disposed on a bottom of a light guide via a carrier, the substrate being selected from a group consisting of metal substrate, metal core printed circuit board and ceramic substrate, the light guide being an optical reflection member including a reflection wall, an upper opening connected with the reflection wall and a lower opening, the lower opening being formed at the bottom of the light guide, the reflection wall being a reflection layer with reflection material, the reflection wall having a bowl-shaped form or a parabolic form on the basis of a reference axis, the carrier being formed with a cavity for assembling with the light-emitting device, the carrier being formed with a window corresponding to the receiving section for the light of the light-emitting unit to output.

32. The light-emitting device as claimed in claim 31, wherein stakes are formed at the bottom of the light guide and the carrier is formed with assembling holes corresponding to the stakes for mounting the carrier at the bottom of the light guide.

* * * * *